United States Patent [19]

Takashima

[11] Patent Number: 4,843,035

[45] Date of Patent: Jun. 27, 1989

[54] METHOD FOR CONNECTING ELEMENTS OF A CIRCUIT DEVICE

[75] Inventor: Shoji Takashima, Tokyo, Japan

[73] Assignee: Clarion Co., Ltd., Tokyo, Japan

[21] Appl. No.: 400,815

[22] Filed: Jul. 22, 1982

[30] Foreign Application Priority Data

Jul. 23, 1981 [JP] Japan .................................. 56-115503
Jul. 31, 1981 [JP] Japan .................................. 56-120445

[51] Int. Cl.⁴ ............................................ H01L 21/60
[52] U.S. Cl. ..................................... 437/209; 29/836; 174/68.5; 357/80
[58] Field of Search ................... 29/577 C, 588, , 593, 29/836; 174/68.5; 357/80, 81, 75; 361/386, 387, 406

[56] References Cited

U.S. PATENT DOCUMENTS

| 3,903,590 | 9/1975 | Yogogawa | 357/80 X |
| 4,242,157 | 12/1980 | Gehle | 29/593 X |
| 4,466,181 | 8/1984 | Takishmsa | 357/75 X |

Primary Examiner—Carl J. Arbes
Attorney, Agent, or Firm—Flynn, Thiel, Boutell & Tanis

[57] ABSTRACT

A method for connecting circuit elements in which plural circuit elements are placed on a plane with their front surfaces being in contact with the plane, an insulative adhesive is introduced into the space between the circuit elements unites them together, the united circuit elements are adhered on a substrate with their back surfaces being in contact with the substrate, and finally, metallic wiring is so formed as to extend along the front surfaces of these circuit elements.

15 Claims, 7 Drawing Sheets

METHOD FOR CONNECTING ELEMENTS OF A CIRCUIT DEVICE

BACKGROUND OF THE INVENTION

1. Field of the Invention

This invention relates to a method for connecting circuit elements so as to prevent wire-cut of wiring between semiconductive pellets due to unevenness of the surfaces of the pellets, and to a circuit device manufactured by this method.

2. Description of the Prior Art

When providing wiring on circuit elements for connection between semiconductive pellets or between these semiconductive pellets and an insulative substrate, it is necessary to locate surfaces of those circuit elements on a common plane. FIG. 1 shows a connecting method which has been used conventionally. Namely, semiconductive pellets 3A and 3B are disposed on a substrate 1 by way of an adhesive 2 and an insulative adhesive 4 fills the space between the semiconductive pellets 3A and 3B. Thereafter, as shown in FIG. 2, metallic wiring 5 is provided so as to extend along the surfaces of the semiconductive pellets 3A using a photolithographic method.

However, since it is difficult to evenly spread the adhesive 2, it is also difficult to place the semiconductive pellets 3A and 3B so that the front surfaces thereof make one plane. Further, the surface of the insulative adhesive 4 does not become flat, either. Due to those reasons, the metalic wiring 5 has been apt to be cut at the corners a and b of the semiconductive pellets 3A and 3B. Additionally, since unevenness of the surface for providing the wiring does not allow precise working by such a photolithographic method, it has been difficult to provide metallic wiring of a fine pattern.

SUMMARY OF THE INVENTION

Accordingly, the present invention has as an object overcoming the above-mentioned problems. To this end, circuit elements are disposed on a plane and are united with each other by an insulating adhesive, and a metallic wiring is thereafter provided on a substantially perfect plane comprising surfaces of the circuit elements and the insulative adhesive.

In accordance with the present invention, there is provided a method for connecting circuit elements which comprises:

locating at least two circuit elements on a plane with front surfaces of the former being in contact with the latter and uniting said circuit elements with each other by an insulative adhesive member;

adhering back surfaces of said united circuit elements to a substrate; and providing a metallic wiring extending along the front surfaces of said circuit elements passing along the surface of said insulative adhesive member.

DETAILED DESCRIPTION OF THE PREFERRED EMBODIMENTS

The present invention will be more fully understood from the description hereunder by way of reference to embodiments shown in the accompanying drawings.

FIGS. 3(a) through 3(d) are sectional views showing the method for connecting circuit elements according to the present invention.

Figure 1:
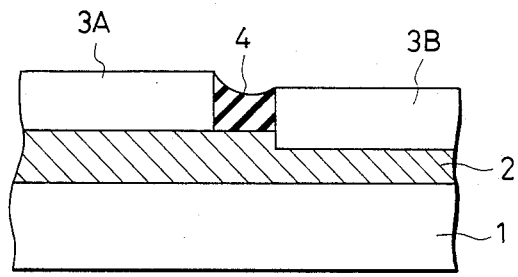
FIGS. 1 and 2 are sectional views showing a conventional circuit device.
Figure 2:
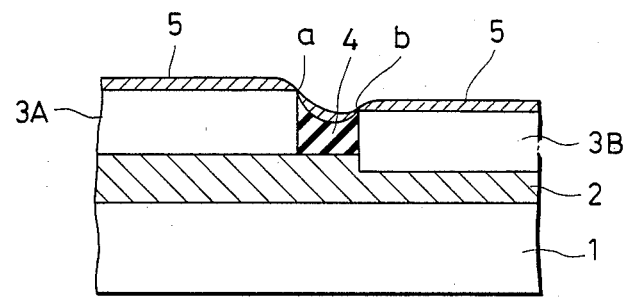
Figure 3:
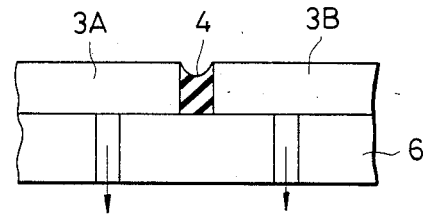
FIGS. 3(a) through 3(d), 4(a) through 4(e) and 5(a) through 5(d) are sectional views showing embodiments according to the present invention.
Figure 3:
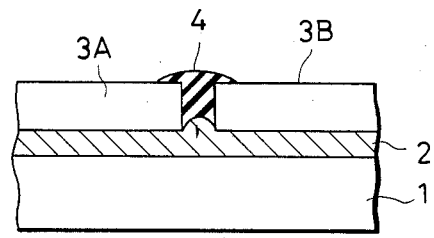
Figure 3:
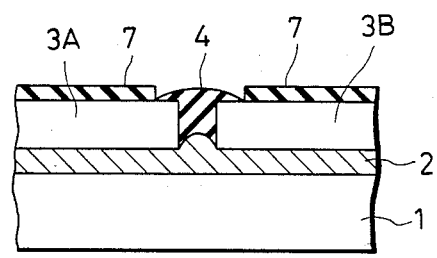
Figure 3:
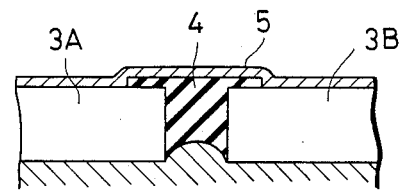

Semiconductive pellets 3A and 3B are first placed upside down on a support member which is a vacuum chuck 6 as shown in FIG. 3(a). The vacuum chuck 6 is made of a fluoroethylene resin, polyethylene, silicone resin, etc. which is not adhesive to an insulative adhesive 4 to be used next. The chuck 6 has a flat and smooth upwardly facing support surface.

While holding the semiconductive pellets 3A and 3B in place by vacuum using the vacuum chuck 6, the space between these pellets is filled with the insulative adhesive 4 made of a fluidized polymeric compound like polyimide, epoxy resin, etc. After curing the insulative adhesive 4, the united semiconductive pellets 3A and 3B are taken off the vacuum chuck 6. Due to the flatness of the surface on the vacuum chuck 6, the surfaces of the semiconductive chips 3A and 3B and the surface of the insulative adhesive 4 make one even plane.

Next, as shown in FIG. 3(b), the semiconductive pellets 3A and 3B are secured to the substrate 1 by an adhesive 2 so that the back surfaces of the pellets contact with the adhesive. The front surfaces of the semiconductive pellets 3A and 3B are thereafter provided with photoresist 7 by a photolithographic method as shown in FIG. 3(c) to thereby use the photoresist 7 as a mask to remove the overflown part of the insulative adhesive 4 by etching.

A metallic material is adhered throughout the flat surfaces of the semiconductive pellets 3A and 3B and the insulating adhesive 4 by a known vapor deposition method or sputtering method. Finally, by removing unnecessary parts of the metallic material by a photolithographic method, metallic wiring 5 extending along the surfaces of the semiconductive pellets 3A and 3B is formed in a desired configuration. In this case, electrodes of the pellets 3A and 3B to be connected by the wiring 5 may be previously provided on the surfaces of the pellets 3A and 3B, respectively, or, they may be simultaneously formed upon providing the metallic wiring 5. The latter method may be easily performed by changing pattern of the mask to be used in the photolithographic process.

With this manner, since the metallic material is provided on a plane which is made by the surfaces of the semiconductive pellets 3A and 3B without unevenness and the metallic wiring is sequently formed by a photolithographic method in a desired configuration, undesired wire-cut due to unevenness of the surfaces of the pellets does not occur.

Figure 4A:
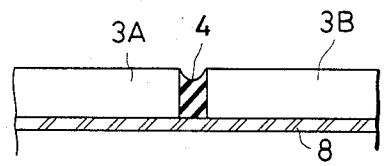
Figure 4B:
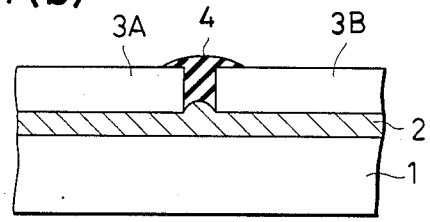
Figure 4C:
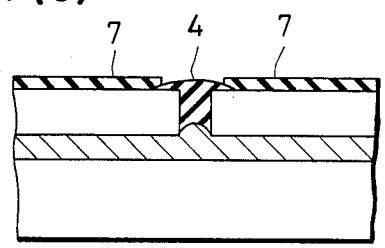
Figure 4D:
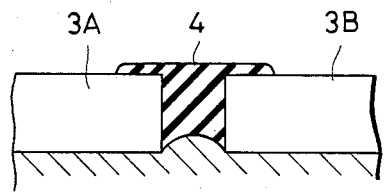
Figure 4E:
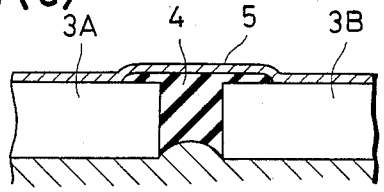

FIGS. 4(a) through 4(e) show another embodiment according to the present invention in which the semiconductive pellets 3A and 3B are adhered on a film 8 with the front surfaces of the former being in contact with the latter. Keeping this state, an insulative adhesive 4 made of a polymeric compound is poured in the space between the semiconductive pellets 3A and 3B. After curing the insulative adhesive 4 to unite the pellets 3A and 3B, the film 8 is removed from the surfaces of the pellets 3A and 3B. The united pellets are thereafter secured on the substrate by the adhesive 2 with the back surface of the former being in contact with the latter as shown in FIG. 4(b). On the surfaces of the pellets 3A and 3B is provided the photoresist 7 as shown in FIG. 4(c). Subsequently, by using the photoresist 7 as a mask, the overflown part of the insulative adhesive 4 is removed by etching as shown in FIG. 4(d). Finally, the metallic wiring 5 with a desired configuration is formed as shown in FIG. 4(e) in the same manner as the former embodiment.

Figure 5A:
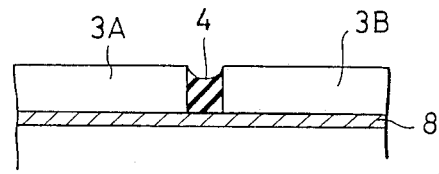
Figure 5B:
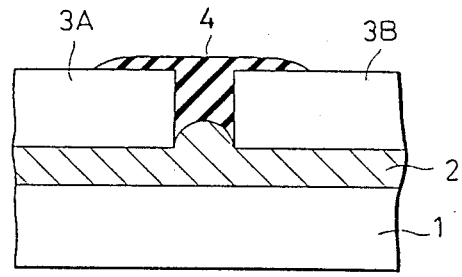
Figure 5C:
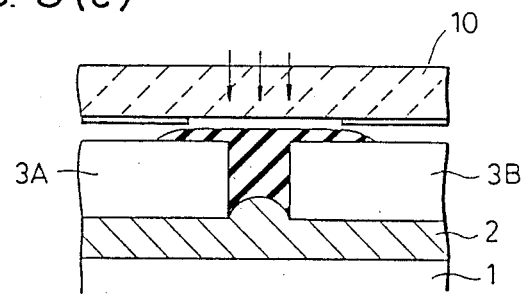
Figure 5D:
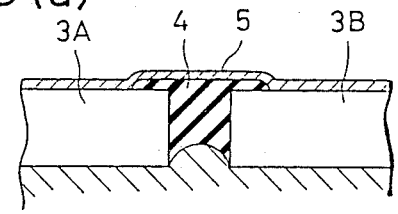

FIGS. 5(a) through 5(d) show a further embodiment according to the present invention. The semiconductive pellets 3A and 3B are first adhered on the film 8 with the front surfaces of the former being in contact with the latter as shown in FIG. 5(a). The space between the pellets 3A and 3B is filled with the insulative adhesive 4 which may be a negative-type photoresist. By curing the insulative adhesive 4, the pellets 3A and 3B are united together. After removing the film 8, the united pellets 3A and 3B are secured on the substrate 1 with the back surfaces of the former being in contact with the latter as shown in FIG. 5(b). The overflown part of the insulative adhesive 4 is thereafter removed by exposure and developing process using a photomask 10 against said negative-type photoresist as shown in FIG. 5(c). Finally, the metallic wiring having a desired configuration is formed as shown in FIG. 5(d) in the same manner as the former embodiments.

Each method described in the above can attain substantially the same effect.

As apparent from the description in the above, according to the present invention, the metallic wiring is provided on an even plane which is formed by surfaces of circuit elements by putting those elements upside down on a plane and uniting them by an insulative adhesive provided therebetween. Therefore, wire-cut due to unevenness of the surface for providing the wiring can be prevented. Further, said evenness leads to improvement of accuracy of a photolithographic method. This further leads to realization of a metallic wiring of a fine pattern and increase of use of the circuit device in the technical field of the highly-integrated IC.

The method according to the present invention as described in the above may be adopted also in manufacture of semiconductive devices including a plurality of chips made of different materials, particularly of semiconductive material and piezoelectric material, respectively.

For example, one of recent remarkable studies in this technical field is to develop semiconductive devices such as surface wave amplifiers, surface convolvers, etc.; through interaction of a surface elastic wave and an internal carrier of a semiconductor, the former performs linear action such as attenuation, amplification or the like, while the latter performs non-linear action such as convolution, correlation or the like.

In this connection, surface elastic wave elements for generating the surface elastic wave and semiconductive elements for generating the internal carrier are needed. Generally, the former is made of a piezoelectric material like $LiNbO_3$, $LiTaO_3$, etc. while the latter is made of a semiconductive material like silicon, an intermetallic compound, etc. Both elements are to be disposed on a common substrate and electrically connected to each other.

Figure 6:
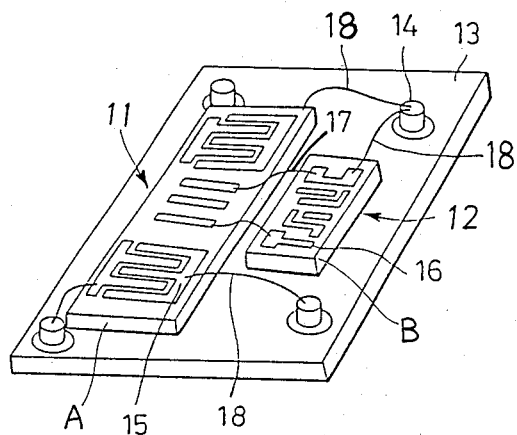
FIG. 6 is a perspective view showing an example of conventional semiconductive device.

FIG. 6 is a perspective view of a structure of conventional semiconductive devices in which reference numeral 11 refers to a surface elastic wave element made which includes a chip A, 12 to a semiconductive element which includes a chip B, 13 to a package substrate on which both chips A and B are located, 14 to lead terminals provided on the package substrate, 15 and 16 to plural electrodes provided on the chips A and B, respectively, 17 to a bonding wire connecting two electrodes 15 and 16, and 18 to bonding wires connecting respective electrodes 15 and 16 to the associated lead electrodes 14, respectively.

However, since the surface elastic wave element 11 and the semiconductive element 12 are made of different materials from each other, there are many problems of manufacturing method upon assembling them to make a single semiconductive device. For example, on the surface of the surface elastic wave element are provided many stripe-shaped electrodes 15 which are called transducers and are each made of an aluminum strip 1 to 2 microns wide for permitting incoming and outgoing of electrical signals. These extremely narrow electrodes 15 have to be connected to the electrodes on the surface of the semiconductive element by means of aluminum or silver wire 17 which is about 25 micron thick by wire bonding method. In this case, since the narrow electrodes 15 are formed by a photolithographic method, their thickness is usually limited to 0.3 through 0.5 microns. However, thickness more than 1 micron is needed to do reliable connection by such wire bonding method.

Further, since the wire connected by the wire bonding method extends between the elements by passing through the air, lead capacitance and feedthrough increase when dealing with high frequency signals, resulting in extreme deterioration of characteristics of the semiconductive device.

To overcome the above-mentioned drawbacks, it is proposed to locate a plurality of semiconductive chips made of different materials on one plane through an insulative adhesive means and thereby provide metallic wiring between those chips in a manner so that the wiring is located directly on the surfaces of the chips. That is, the above-described method according to the present invention is effective when used for manufacturing such a semiconductive device.

Figure 7:
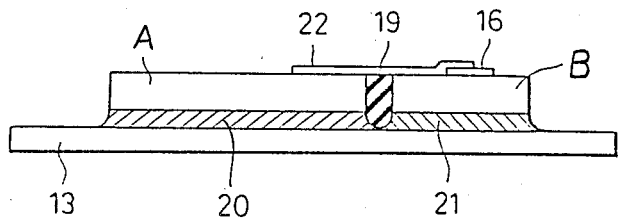
FIG. 7 is a sectional view showing a semiconductive device to which the method according to the present invention is applied.

FIG. 7 is a sectional view of a semiconductive device according to an embodiment of the present invention in which parts corresponding to those in FIG. 6 are designated by the same reference numerals. 19 is an insulative adhesive member filling the space between the chip A for the surface elastic wave element 11 and the chip B for the semiconductive element 12 with its surface being in alignment with the surfaces of the chips A and B. The insulative adhesive member is made of a polymeric compound like polyimide, epoxy resin, etc. Reference numeral 20 designates another insulative adhesive member provided between the back surface of the chip A and the package substrate 13. This is made of a flexible material with elasticity i.e. a resin of a silicone group, epoxy group, etc. 21 is a conductive adhesive member provided between the back surface of the chip B and the package substrate 13. This is made of a resin material including metallic powder and maintained in a good electric and radiative condition. 22 is metallic wiring made of aluminum, gold, etc. disposed in close contact with the surfaces of the chips A and B for electrically connecting them. The metallic wiring 22 is formed by first providing a metallic material throughout the surfaces of the chips A and B and the insulating adhesive member 19 by a vapor deposition method and thereafter removing unnecessary parts of the metallic material by a photolithographic method in a desired configuration. When making this metallic wiring 22, electrodes of the chips, particularly said extremely narrow electrodes 15 on the surface of the chip A, for example, may be simultaneously formed. They can easily be made only by changing pattern of the mask to be used in the photolithographic process.

Figure 8:
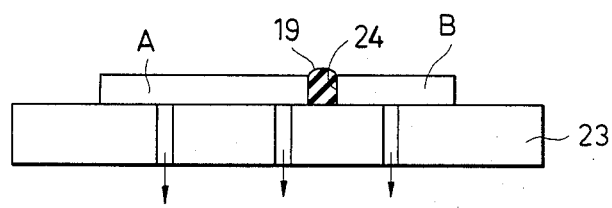
FIGS. 8(a) through 8(c) are sectional views showing an embodiment of the method for manufacturing the semiconductive device of FIG. 7 according to the present invention.
Figure 8:
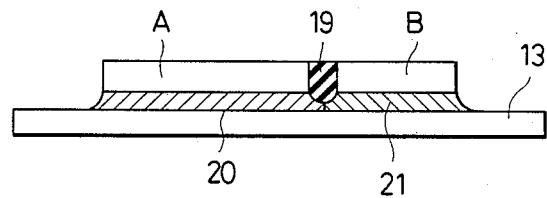
Figure 8:
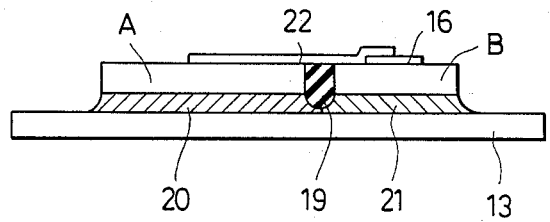

FIGS. 8(a) through 8(c) are sectional views showing the method for manufacturing the semiconductive device according to the present invention. The manufacturing process will now be described hereunder referring to those drawings.

As shown in FIG. 8(a), the chips A and B are horizontally located on a vacuum chuck 23 with the front surface (surface for providing electrodes) of the former being in contact with the support surface of the chuck and with a space 24 between the chips A and B. The vacuum chuck 23 is made of fluoroethylene resin, polyethylene, silicon resin or the like which is not adhesive to the insulative adhesive 19 to be used later and has an even and plane surface.

While holding the chips A and B on the vacuum chuck 23 using a vacuum, the space 24 is completely filled with a fluidized polymeric compound like polyimide, epoxy resin, etc. After curing the polymeric compound by a determined method to form the insulative adhesive member 19, the chips A and B which are united together by the adhesive member 19 are taken up from the chuck 23. Due to the flatness of the surface of the chuck 23, the surfaces of the chips A and B and the surface of the insulative adhesive member 19 are completely aligned on the same plane.

As shown in FIG. 8(b), spreading an insulative adhesive on a silicone group, epoxy group, etc. on the back surface of the chip A and a conductive adhesive like conductive resins, etc. on the back surface of the chip B, respectively, the united chips A and B are located on the package substrate 13 made of a metallic material or an insulative plate having a conductive layer. By providing curing treatment, the insulative adhesive member 20 and the conductive adhesive member 21 are formed. It should be noted that the combination of materials of these adhesive members may adequately be selected in accordance with materials and shapes of the chips A and B without being limited to the described ones.

As shown in FIG. 8(c), a metallic material like aluminum, gold, etc. is deposited on the surfaces of the chips A and B which are fixed on the package substrate 13 by a known vapor deposition method or sputtering method. Subsequently, by removing unnecessary parts of the metallic material by a photolithographic method, the metallic wiring 22 extending over the surfaces of the chips A and B in a desired configuration can be obtained. Either of the electrodes 15 and 16 of the chips A and B or both of them may be formed simultaneously with the formation of the metallic wiring 22 by the photolithographic method.

Thus, the semiconductive device as shown in FIG. 7 can be produced.

Figure 9:
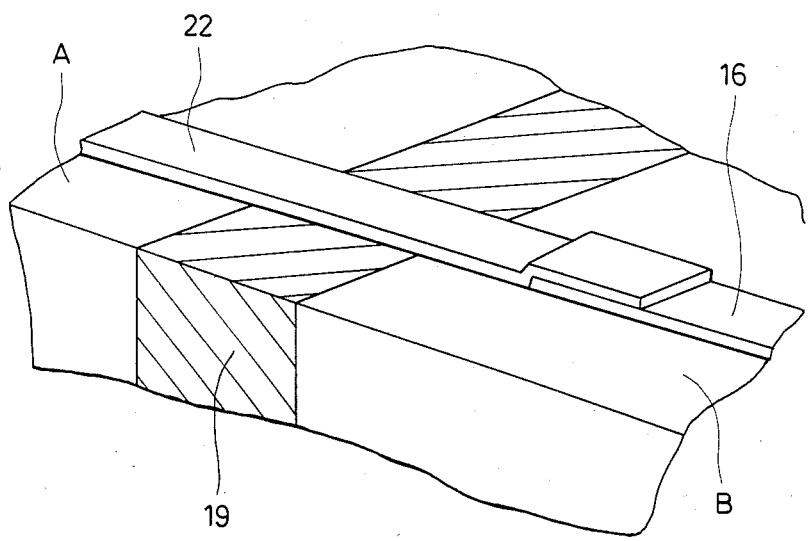
FIG. 9 is an enlarged perspective view showing a part of the semiconductive device of FIG. 7.

FIG. 9 is an enlarged perspective view particularly showing part of the metallic wiring 22 and its vicinity.

As apparent from the description, by applying to the manufacturing of semiconductive devices the method according to the present invention, wherein plural chips made of different materials are located on the same plane through the insulative adhesive member and the metallic wiring is provided on the surface of the chips so as to closely contact therewith, bonding of the wiring is not necessary. This enables electrically connecting the chips without direct dependency on the thickness of the metallic wiring, leading to a reliable connection of the circuit elements.

Further, since the metallic wiring has no part floating in the air between chips, even when dealing with a high frequency signal an increase of lead capacity or feedthrough can prevented. Accordingly, deterioration of characteristics of the semiconductive device can be prevented.

Particularly according to the embodiment wherein the extremely narrow electrodes are provided simultaneously with the formation of the metallic electrode by the photolithographic method, characteristics of the semiconductive devices, including surface elastic wave elements which need such narrow electrodes, can be easily improved. This leads to wider use of these semiconductive devices.

The embodiments of the invention in which an exclusive property or privilege is claimed are defined as follows:

1. A method of interconnecting two circuit elements which each have a front surface and a back surface on opposite sides thereof, comprising the steps of:
   providing a support member having a substantially planar support surface thereon;
   releasably securing said circuit elements to said support member at spaced locations thereon so that said front surface on each said circuit element is disposed against said support surface on said support member;
   thereafter introducing a first insulating adhesive material between said circuit elements so that it engages said circuit elements and a portion of said support surface on said support member, and then permitting said first insulative adhesive material to cure, said first insulative adhesive material connecting said circuit elements;
   thereafter removing said circuit elements and said first insulative adhesive material from said support member, said front surfaces of said circuit elements being substantially coplanar;
   securing said circuit elements to a substrate with an orientation so that said back surfaces thereof face said substrate; and
   providing metallic wiring which is located directly on and extends along said front surfaces of said circuit elements and a surface on said first insulating adhesive material;
   wherein one of said circuit elements is a semiconductive chip and the other of said circuit elements is a surface acoustic wave chip;
   wherein a further insulative adhesive material is provided between said surface acoustic wave chip and said substrate, and wherein a conductive adhesive material is provided between said semiconductive chip and said substrate.

2. The method of claim 1, wherein said support member is a film.

3. The method of claim 1, wherein said support member is a vacuum chuck.

4. The method of claim 3, wherein said vacuum chuck is made of a material which prevents just insulative adhesive material from adhering to said vacuum chuck.

5. The method of claim 4, wherein said vacuum chuck is made of one of a fluoroethylene resin, a polyethylene, and a silicon resin.

6. The method of claim 1, wherein said first insulative adhesive material is a photoresist.

7. The method of claim 1, wherein said further insulative adhesive material is a resiliently flexible material which is a resin of one or an epoxy group and a silicone group, and wherein said conductive adhesive material is a resin having a metallic powder therein.

8. The method of claim 1, including after said removing step and prior to said step of providing said metallic wiring the steps of photolithographically providing a photoresist on said front surfaces of said circuit elements, and thereafter removing a portion of said first insulative adhesive material by etching, said photoresist masking said front surfaces of said circuit elements.

9. The method of claim 1, wherein said surface on said first insulative adhesive material is formed by engagement of said insulative adhesive material with said support surface on said support member and is substantially coplanar with said front surfaces of said circuit elements.

10. The method of claim 1, wherein said first insulative adhesive material is a fluidized polymeric compound.

11. The method of claim 10, wherein said first insulative adhesive material is one of a polyimide and an epoxy resin.

12. The method of claim 1, wherein said step of providing said metallic wiring includes the steps of: utilizing one of vapor deposition and sputtering to provide a metallic layer on said front surfaces of said circuit elements and on said surface of said first insulative adhesive material; and thereafter utilizing photolithography to remove selected portions of said metallic layer, the remaining portions of said metallic layer being said metallic wiring.

13. The method of claim 12, wherein said metallic wiring is one of gold and aluminum.

14. The method of claim 12, wherein said step of providing said metallic wiring includes the step of simultaneously forming an electrode on one of said circuit elements.

15. The method of claim 1, including after said removing step and prior to said step of providing said metallic wiring the steps of positioning a photomask over said front surfaces of said circuit elements and thereafter removing a portion of said first insulative adhesive material by exposing and developing techniques, said photomask masking said front surfaces of said circuit boards.

* * * * *

UNITED STATES PATENT AND TRADEMARK OFFICE
CERTIFICATE OF CORRECTION

PATENT NO. : 4 843 035

DATED : June 27, 1989

INVENTOR(S) : Shoji TAKISHIMA

It is certified that error appears in the above-identified patent and that said Letters Patent is hereby corrected as shown below:

Column 6, line 45; change "insulating" to ---insulative---.

lines 61 and 62; change "insulating" to ---insulative---.

Column 7, line 8; change "just" to --said first--.

line 19; change "or" to ---of---.

Signed and Sealed this

Seventeenth Day of July, 1990

Attest:

HARRY F. MANBECK, JR.

Attesting Officer          Commissioner of Patents and Trademarks

UNITED STATES PATENT AND TRADEMARK OFFICE
CERTIFICATE OF CORRECTION

PATENT NO. : 4,843,035

DATED : June 27, 1989

INVENTOR(S) : Shoji TAKISHIMA

It is certified that error appears in the above-identified patent and that said Letters Patent is hereby corrected as shown below:

On the title page, under item [19] and in item [75], change the inventor's last name from "Takashima" to --Takishima--.

Signed and Sealed this

Tenth Day of December, 1991

Attest:

HARRY F. MANBECK, JR.

Attesting Officer

Commissioner of Patents and Trademarks